US010119770B2

(12) United States Patent
Aoki et al.

(10) Patent No.: US 10,119,770 B2
(45) Date of Patent: Nov. 6, 2018

(54) PLANAR HEAT PIPE

(71) Applicant: Furukawa Electric Co., Ltd., Tokyo (JP)

(72) Inventors: Hirofumi Aoki, Tokyo (JP); Hiroshi Sakai, Tokyo (JP); Tatsuro Miura, Tokyo (JP); Yoshikatsu Inagaki, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/507,027

(22) PCT Filed: Aug. 17, 2015

(86) PCT No.: PCT/JP2015/073018
§ 371 (c)(1),
(2) Date: Feb. 27, 2017

(87) PCT Pub. No.: WO2016/031604
PCT Pub. Date: Mar. 3, 2016

(65) Prior Publication Data
US 2017/0248378 A1 Aug. 31, 2017

(30) Foreign Application Priority Data

Aug. 29, 2014 (JP) .................................. 2014-176173

(51) Int. Cl.
*F28D 15/00* (2006.01)
*F28F 1/04* (2006.01)
(Continued)

(52) U.S. Cl.
CPC ................ *F28F 1/04* (2013.01); *B23K 11/02* (2013.01); *B23K 11/115* (2013.01); *B23K 26/21* (2015.10);
(Continued)

(58) Field of Classification Search
CPC . F28F 1/04; B23K 26/21; B23K 11/02; F28D 15/02; F28D 15/0233; F28D 15/04; F28D 15/046
(Continued)

(56) References Cited

U.S. PATENT DOCUMENTS

2003/0173064 A1   9/2003   Ueki et al.
2004/0159422 A1*  8/2004   Zuo .................. F28D 15/046
                                              165/104.14
(Continued)

FOREIGN PATENT DOCUMENTS

JP    06-155030 A      6/1994
JP    2001-334333 A   12/2001
(Continued)

OTHER PUBLICATIONS

Decision to Grant received on Apr. 26, 2017 in a counterpart TW application No. 104127448.
(Continued)

*Primary Examiner* — Davis Hwu
(74) *Attorney, Agent, or Firm* — Pearne & Gordon LLP

(57) ABSTRACT

A planar heat pipe includes a container having a hollow portion provided at a central portion thereof with two opposing plate-shaped bodies, and a working fluid enclosed in the hollow portion. The hollow portion is provided with a wick structure. At least one of the plate-shaped bodies is a composite member of two or more types of metal members that are laminated and integrated. A metal member of the composite member forming a layer that contacts the hollow portion has a thermal conductivity of greater than or equal to 200 W/m·K and a metal member of the composite member forming a layer that contacts an exterior has a thermal conductivity of less than or equal to 100 W/m·K, a peripheral portion of the hollow portion being sealed.

7 Claims, 1 Drawing Sheet

(51) Int. Cl.
    *B23K 26/21*   (2014.01)
    *B23K 11/02*   (2006.01)
    *B23K 11/11*   (2006.01)
    *F28D 15/04*   (2006.01)
    *H01L 23/427*  (2006.01)

(52) U.S. Cl.
    CPC .......... *F28D 15/04* (2013.01); *F28F 2245/00* (2013.01); *F28F 2255/00* (2013.01); *F28F 2275/06* (2013.01); *F28F 2275/067* (2013.01); *H01L 23/427* (2013.01); *H01L 2924/0002* (2013.01)

(58) Field of Classification Search
    USPC ...................................................... 165/104.21
    See application file for complete search history.

(56) References Cited

U.S. PATENT DOCUMENTS

| 2005/0017910 | A1 | 1/2005 | Park |
| 2007/0068656 | A1 | 3/2007 | Lee et al. |
| 2007/0227704 | A1 | 10/2007 | Nagai et al. |
| 2010/0319884 | A1* | 12/2010 | Okuyama ............... F28D 15/04 165/104.26 |

FOREIGN PATENT DOCUMENTS

| JP | 2002-022378 A | 1/2002 |
| JP | 2002-168575 A | 6/2002 |
| JP | 2003-254685 A | 9/2003 |
| JP | 2003-291241 A | 10/2003 |
| JP | 2003-314979 A | 11/2003 |
| JP | 2004-028442 A | 1/2004 |
| JP | 2004-095684 A | 3/2004 |
| JP | 2005-045810 A | 2/2005 |
| JP | 2006-322665 A | 11/2006 |
| JP | 2007-113864 A | 5/2007 |
| JP | 2007-266153 A | 10/2007 |
| JP | 2013-173248 A | 9/2013 |

OTHER PUBLICATIONS

Notification to Grant Utility Model Patent Right dated Aug. 14, 2017 in the corresponding CN Utility Model application No. 201590000902.3.
International Search Report and Written Opinion from Corresponding Application No. PCT/JP2015/073018; dated Sep. 28, 2015.
Office Action from Corresponding Application No. TW 104127448; dated Oct. 17, 2016.
English Translation of Written Opinion from Corresponding Application No. PCT/JP2015/073018; dated Sep. 28, 2015.
English Translation of International Preliminary Report on Patentability from Corresponding Application No. PCT/JP2015/073018; dated Mar. 9, 2017.
Notification of reasons for refusal dated Jan. 13, 2015 in the corresponding JP application No. 2014-176173 and English translation.
Notification of reasons for refusal dated Apr. 13, 2015 in the corresponding JP application No. 2014-176173 and English translation.
Decision to Grant a patent dated Jul. 6, 2015 in the corresponding JP application No. 2014-176173 and English translation.

* cited by examiner

PLANAR HEAT PIPE

CROSS REFERENCE TO RELATED APPLICATIONS

This is the National Stage of International Application No. PCT/JP2015/073018, filed Aug. 17, 2015, which claims the benefit of Japanese Patent Application No. 2014-176173, filed Aug. 29, 2014, the disclosures of which are hereby incorporated by reference in their entirety.

TECHNICAL FIELD

The present invention relates to a planar heat pipe in which a distortion of a container is reduced and has an excellent compatibility with a working fluid such as water.

BACKGROUND ART

Electronic components such as semiconductor devices installed in electric/electronic devices produce an increased amount of heat due to high density packaging or the like along with improvement in functionality, and importance of cooling of such electronic components is increasing recently. Planar heat pipes may be used for cooling electronic components.

When a copper material, which is a material having excellent compatibility with water, which is a widely-used working fluid, is used as a container material of a planar heat pipe, in order to seal a hollow portion having a wick structure, it is common to join a periphery of the hollow portion by brazing or soldering, since a copper material has a high thermal conductivity and a low electric resistance. However, with a sealing method using brazing or soldering, it is necessary to heat copper material, which is a container material, at a high temperature, and thus there is a problem of a tendency that a rigidity of the container material decreases and a pressure resistance of the planar heat pipe deteriorates.

On the other hand, when a material other than a copper material, e.g., stainless steel, is used as a container material to prevent the decrease in pressure resistance of the planar heat pipe due to brazing or soldering, there is a problem of a poor compatibility with water, which is a widely-used working fluid.

Further, a cladded material including two types of metal members may be used as a container material. A planar heat pipe has been proposed in which a member having a double-layered structure of a copper material and an aluminum material is used as a cladded material to reduce weight and improved workability, and a surface of the cladded material forming the wall of the container is made of a copper material (Patent Document 1).

However, the planar heat pipe of patent document 1 includes a copper material and an aluminum material, which are both materials having a relatively high thermal conductivity, and thus the container may deform upon sealing the hollow portion described above by laser beam welding or by resistance welding.

DOCUMENT LIST

Patent Document(s)

Patent Document 1: Japanese Laid-Open Patent Publication No. 2002-168575

SUMMARY OF INVENTION

Technical Problem

In view of the circumstances described above, it is an object of the present invention to provide a planar heat pipe having a reduced distortion of the container, and having an improved airtightness of the hollow portion and compatibility to a working fluid such as water.

Solution to Problem

According to an aspect of the present invention, a planar heat pipe includes a container having a hollow portion provided at a central portion thereof with two opposing plate-shaped bodies, and a working fluid enclosed in the hollow portion, the hollow portion being provided with a wick structure, at least one of the plate-shaped bodies being a composite member of two or more types of metal members that are laminated and integrated, a metal member of the composite member forming a layer that contacts the hollow portion has a thermal conductivity of greater than or equal to 200 W/m·K and a metal member of the composite member forming a layer that contacts an exterior has a thermal conductivity of less than or equal to 100 W/m·K, a peripheral portion of the hollow portion being sealed. Note that the thermal conductivity in the present specification is value at 25° C.

According to the planar heat pipe of the present invention, the peripheral portion of the hollow portion is sealed by laser beam welding.

According to the planar heat pipe of the present invention, the peripheral portion of the hollow portion is sealed by resistance welding.

According to the planar heat pipe of the present invention, the composite member is a cladded material or a plated material.

According to the planar heat pipe of the present invention, the metal member forming the layer that contacts the hollow portion is of copper, and the metal member forming the layer that contacts the exterior is of stainless steel.

According to the planar heat pipe of the present invention, the metal member forming the layer that contacts the hollow portion has a layer thickness of less than or equal to half a thickness of the composite member.

According an aspect of the present invention, a heat sink is equipped with the above-mentioned planar heat pipe.

Effects of Invention

According to an aspect of the present invention, since a container material of the planar heat pipe is a composite member in which a metal member forming a layer that contacts the hollow portion has a thermal conductivity of greater than or equal to 200 W/m·K and a metal member forming a layer that contacts the exterior has a thermal conductivity of less than or equal to 100 W/m·K, when sealing a peripheral portion of the hollow portion, firstly, the metal member having a thermal conductivity of less than or equal to 100 W/m·K, which is the layer that contacts the exterior, rapidly melts and releases heat of fusion, and the heat of fusion released from the metal member having a thermal conductivity of less than or equal to 100 W/m·K is smoothly transferred to the metal member having a thermal conductivity of greater than or equal to 200 W/m·K, i.e., a relatively high thermal conductivity, which is the layer that contacts the hollow portion, and said metal member also rapidly melts, and thus an occurrence of distortion in the container can be prevented, a planar heat pipe having a high flatness is obtained.

Also, since the metal member which is a layer that contacts the exterior and the metal member which is a layer that contacts the hollow portion both melts rapidly, a planar heat pipe in which the hollow portion having a wick structure has an excellent airtightness can be obtained. Further, since the metal member forming the layer that contacts the hollow portion has a high thermal conductivity of greater than or equal to 200 W/m·K, a planar heat pipe having an excellent compatibility with a working fluid such as water and also an excellent heat transportation property is obtained.

According to an aspect of the invention, since the hollow portion is sealed by laser beam welding, the metal member having a thermal conductivity of less than or equal to 100 W/m·K, which is the layer that contacts the exterior, melts more rapidly and releases heat of fusion, and the heat of fusion is smoothly transferred to the metal member having a thermal conductivity of greater than or equal to 200 W/m·K, which is the layer that contacts the hollow portion, and melts more rapidly than said metal member, when performing a sealing process by laser beam welding, an occurrence of distortion in the container can be further reduced, and an airtightness of the hollow portion having a wick structure is further improved. It is to be noted that the reason why, when the metal member having a thermal conductivity of less than or equal to 100 W/m·K is irradiated with a laser beam, said metal member melts more rapidly is that, since a metal member having a lower thermal conductivity also has a lower electric conductivity, and a metal member having a lower electric conductivity has a higher absorption rate of laser beam, when a metal member having a lower thermal conductivity is irradiated with a laser beam, said metal member absorbs an energy of the laser beam and melts more rapidly.

According to an aspect of the present invention, since the hollow portion is sealed by resistance welding, the metal member having a thermal conductivity of less than or equal to 100 W/m·K, which is the layer that contacts the exterior, melts more rapidly, when performing a sealing process by resistance welding, an occurrence of distortion in the container can be further reduced, and an airtightness of the hollow portion having a wick structure is further improved. It is to be noted that the reason why, when resistance welding which causes a welding current to flow through the metal member having a thermal conductivity of less than or equal to 100 W/m·K, said metal member melts more rapidly is that, since an electric current is applied to a metal member having a lower thermal conductivity, a higher Joule heat is produced, when a resistance welding is applied to a metal member having a lower thermal conductivity, said metal member melts more rapidly.

According to an aspect of the invention, the metal member forming the layer that contacts the hollow portion is of copper, and the metal member forming the layer that contacts the exterior is of stainless steel, a planar heat pipe having an excellent compatibility with a working fluid such as water, a high rigidity for the container material and a high pressure resistance can be obtained.

DESCRIPTION OF THE EMBODIMENTS

Figure 1:
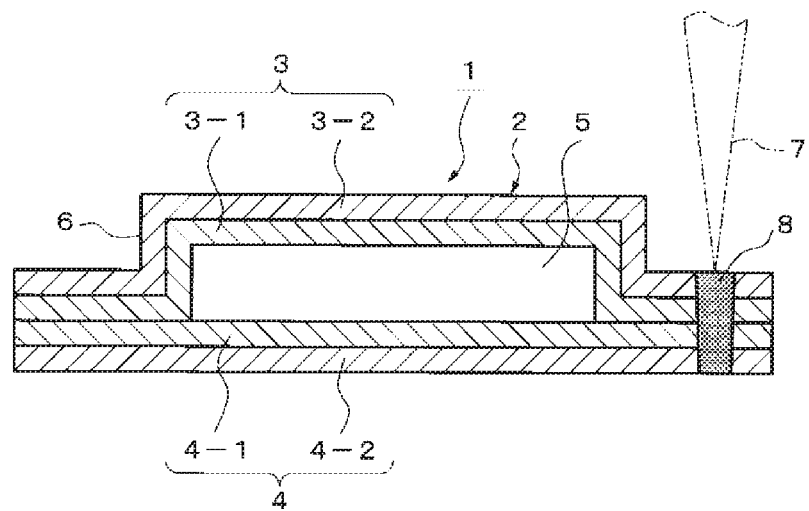
FIG. 1 is a side sectional view of a planar heat pipe according to a first embodiment of the present invention.

Hereinafter, a planar heat pipe according to a first embodiment of the present invention will be described below with reference to the drawings. As shown in FIG. 1, a planar heat pipe 1 according to the first embodiment includes a container 2, which has a rectangular shape in a plan view, and a working fluid (not shown), and the container 2 includes two plate-shaped bodies opposing each other, namely one plate-shaped body 4 and another plate-shaped body 3, that are placed on top of each other, thus a protruded portion 6 having a hollow portion 5 formed at a central part of the container 2. A wick structure (not shown) having a capillary tube structure is accommodated in the hollow portion 5.

The one plate-shaped body 4 has a flat plate shape. The other plate-shaped body 3 also has a flat plate shape and a central part is plastically deformed into a protruded shape. A portion of the plate-shaped body 3 protruding outwardly and deformed plastically into a protruded shape constitutes the protruded portion 6 of the container 2. An inside portion of the protruded portion 6 constitutes the hollow portion 5. As to the planar heat pipe 1, a laser welded portion 8 is formed by a laser beam 7 such that the laser welded portion 8 surrounds a periphery of the protruded portion 6, namely a peripheral portion of the protruded portion 6, to thereby seal the hollow portion 5 and give airtightness to the hollow portion 5. FIG. 1 shows how the laser welded portion 8 is being formed by irradiation of the laser beam 7 to a position corresponding to the one end portion of the container 2 in the side sectional view on the peripheral portion of the protruded portion 6. Therefore, thereafter, irradiation of the laser beam 7 is also applied on a position corresponding to the other end portion of the container 2 in the side sectional view, to thereby form the laser welded portion 8.

The one plate-shaped body 4 and the other plate-shaped body 3 are composite members in which first layers 4-1, 3-1 that contact the hollow portion and second layers 4-2, 3-2 that contact an external environment are laminated and integrated, respectively. As to the one plate-shaped body 4, a metal member forming the first layer 4-1 that contacts the hollow portion has a thermal conductivity of greater than or equal to 200 W/m·K, and a metal member forming the second layer 4-2 that contacts an external environment of the planar heat pipe 1 has a thermal conductivity of less than or equal to 100 W/m·K. As to the other plate-shaped body 3, similarly to the one plate-shaped body 4, a metal member forming the first layer 3-1 that contacts the hollow portion has a thermal conductivity of greater than or equal to 200 W/m·K, and a metal member forming the second layer 3-2 that contacts an external environment of the planar heat pipe 1 has a thermal conductivity of less than or equal to 100 W/m·K.

As to the planar heat pipe 1 according to the first embodiment, each of the first layers 3-1, 4-1 and the second layers 3-2, 4-2 has a single layered structure composed of a single type of metal member.

When a metal member having a low thermal conductivity is irradiated with a laser beam, the metal member rapidly absorbs the energy of the laser beam and melts. Accordingly, for example, when a front face side of the other plate-shaped body 3 is irradiated with the laser beam 7, in other words, when the metal member that is the second layer 3-2 of the other plate-shaped body 3 having a thermal conductivity of less than or equal to 100 W/m·K is irradiated with the laser beam 7, the metal member that is the second layer 3-2 of the other plate-shaped body 3 rapidly melts. The heat of fusion of this metal member is smoothly transferred to the metal member that is the first layer 3-1 of the other plate-shaped body 3, the first layer 3-1 being a layer that contacts the hollow portion 5 and having a thermal conductivity of greater than or equal to 200 W/m·K, namely a relatively high thermal conductivity, and the metal member that is the first layer 3-1 also melts rapidly. Similarly, heat of fusion of the metal member that is the first layer 3-1 of the other plate-shaped body 3 is further transferred to the metal member that is the first layer 4-1 of the one plate-shaped body 4 and the metal member that is the second layer 4-2 of one plate-shaped body 4, and the metal member that are the first metal member of layer 4-1 and the second layer 4-2 rapidly melt. Therefore, by welding with the laser beam 7, occurrence of distortion in the container 2 can be further reduced, and an airtightness of the hollow portion 5 having a wick structure further improves.

Also, since the metal members forming the first layers 3-1 and 4-1 have a thermal conductivity of greater than or equal to 200 W/m·K, which is a high thermal conductivity, a planar heat pipe having a good heat transportation characteristic while having compatibility with the working fluid can be obtained. The thermal conductivity of a metal members forming the first layers 3-1 and 4-1 is not particularly limited as long as it is greater than or equal to 200 W/m·K, but considering a good heat transportation characteristic of the planar heat pipe 1 as well as a heat transfer property of the heat of fusion of the second layers 3-2 and 4-2 to an inner portion of the first layers 3-1 and 4-1 and a heat transfer property to the one plate-shaped body 4, it is preferably greater than or equal to 300 W/m·K, and considering a further improved heat transportation characteristic and further improvement in the heat transfer properties mentioned above, it is particularly preferably greater than or equal to 350 W/m·K.

Further, an upper limit of the thermal conductivity of the metal member forming the first layers 3-1 and 4-1 is not particularly limited, but to positively prevent an occurrence of distortion in the container 2 due to the difference in thermal expansion coefficient with respect to the second layers 3-2 and 4-2 that are formed of the metal members having a thermal conductivity of less than or equal to 100 W/m·K, it is preferably less than or equal to 500 W/m·K and particularly preferably less than or equal to 450 W/m·K.

The type of metal of the metal members of the first layers 3-1 and 4-1 is not particularly limited as long as it is a metal member having the aforementioned thermal conductivity, and a metal material of greater than or equal to 200 W/m·K but less than 300 W/m·K may be, for example, aluminum, aluminum alloy, or the like. A metal material of greater than or equal to 300 W/m·K but less than or equal to 350 W/m·K may be, for example, gold, copper alloy, or the like, and a metal material of greater than or equal to 350 W/m·K but less than or equal to 500 W/m·K may be copper, silver, or the like. Considering good compatibility with water that is commonly used as a working fluid and a good heat transportation property, copper is desirable among the above.

On the other hand, since the metal members that are the second layers 3-2 and 4-2 rapidly absorb the energy of the laser beam and melts, an occurrence of a distortion in the container 2 can be reduced, and an airtightness of the hollow portion having the wick structure also improves. A thermal conductivity of the metal members forming the second layers 3-2 and 4-2 is not particularly limited as long as it is less than or equal to 100 W/m·K, but it is preferably less than or equal to 70 W/m·K since, by rapidly absorbing an energy of the laser beam, an occurrence of a distortion in the container 2 is further reduced and a flatness of the planar heat pipe 1 is further improved, and it is particularly preferably less than or equal to 40 W/m·K considering an improvement in productivity by the speeding-up of the laser beam welding.

The type of metal of the metal members that are the second layers 3-2 and 4-2 is not particularly limited as long as it is a metal member having the aforementioned thermal conductivity, and a metal member of greater than 70 W/m·K but less than or equal to 100 W/m·K may be, example, nickel, iron, or the like, a metal member of greater than 40 W/m·K but less than or equal to 70 W/m·K may be, for example, bronze, tin, or the like, a metal member of less than or equal to 40 W/m·K may be, for example, stainless steel, titanium, or the like. To reduce occurrence of distortion of the container 2 while providing a container 2 having a high rigidity and an improved pressure resistance, stainless steel and titanium are preferable among the above.

The plate-shaped body 4 and the other plate-shaped body 3 that are laminated have a total thickness of, for example, 0.1 mm to 1.0 mm, but it is not particularly limited thereto. Also, the one plate-shaped body 4 has a thickness of, for example, 0.05 mm to 0.5 mm, but it is not particularly limited thereto, and the other plate-shaped body 3 has a thickness of, for example, 0.05 mm to 0.5 mm, but is not particularly limited thereto. A ratio of the thickness of the first layer 3-1, 4-1 to the thickness of second layer 3-2, 4-2 is not particularly limited, and, for example, the ratio of the thickness of the first layer 3-1, 4-1 to the thickness of the second layer 3-2, 4-2 is preferably 0.1 to 1.0 concerning the rigidity of the one plate-shaped body and the other plate-shaped body, and particularly preferably 0.2 to 0.8, concerning the stability and reliability of the welding.

For example, a cladded material or a plated material can be used as a composite member in which the first layer 3-1, 4-1 and the second layer 3-2, 4-2 are laminated and integrated. The cladded material as used herein may be manufactured by a well-known method, and for example, may be manufactured by cleaning a joining surface of the metal member that is the first layer 3-1, 4-1 and a joining surface of the metal member that is the second layer 3-2, 4-2, performing a predetermined activation treatment, and thereafter, placing the joining surfaces of both metal members one over another, joining by cold rolling and by applying a heat-treatment. Also, the plating materials as used herein can be manufactured by a well-known method, and, for example, can be manufactured by applying electroless plating or electroplating to the metal member forming the second layer 3-2, 4-2, which is a member to be plated, to form the first layer 3-1, 4-1 on the second layer 3-2, 4-2.

A laser used in forming the laser welded portion 8 is not particularly limited, but may be, for example, a fiber laser with a small condensing diameter on a laser irradiation side surface of the container 2, for example, the condensing diameter of 20 to 200 μm, for a high-speed machining and for decreasing a welding width of the laser welded portion 8 to prevent a distortion in the hollow portion 5.

The working fluid to be enclosed in the hollow portion 5 can be selected as appropriate depending on the compatibility with the material of the container 2, and may be, for example, water. Other working fluids may include chlorofluorocarbon alternative, fluorinert, or cyclopentane. A wick structure having a capillary tube structure (not shown) may be, for example, a thin plate having a mesh, wire, etc.

The planar heat pipe according to the second embodiment of the present disclosure will described with reference to the drawings. Note that components that are the same as those of the planar heat pipe according to the first embodiment will be described using the same reference numerals.

Figure 2:
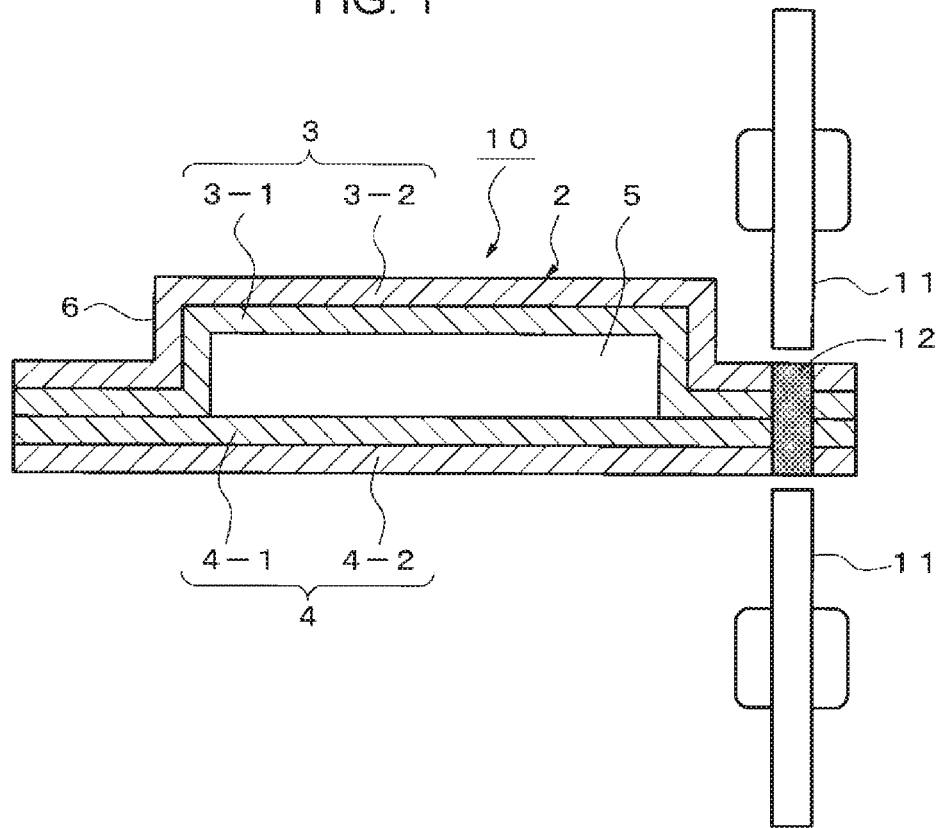
FIG. 2 is a side cross sectional view of a planar heat pipe according to a second embodiment of the present invention.

As shown in FIG. 2, in place of the planar heat pipe 1 according to the first embodiment in which the hollow portion 5 is sealed by forming the laser welded portion 8 at the peripheral portion of the protruded portion 6 with the laser beam 7, with the planar heat pipe 10 according to the second embodiment, the hollow portion 5 is sealed by forming a welded portion 12 by the resistance welding machine with a resistance welding machine 11 such as the seam welding machine at the peripheral portion of the protruded portion 6. Note that FIG. 2 shows, similarly to FIG. 1, how a welded portion 12 is formed on the peripheral portion of protruded portion 6 by a resistance welding machine with the resistance welding machine 11 at a position corresponding to the one end portion of the container 2 in the side sectional view. Therefore, thereafter, the welded portion 12 by the resistance welding machine is formed with the resistance welding machine 11 at a position corresponding to the other end portion of the container 2 in the side sectional view.

When an electric current is applied to a metal member having a low thermal conductivity, a high Joule heat is produced. Accordingly, when resistance welding such as seam welding is performed that causes an electric current to flow through the metal members that are the second layers 3-2 and 4-2 having a thermal conductivity of less than or equal to 100 W/m·K, the metal members that are the second layers 3-2 and 4-2 rapidly melt. The heat of fusion of these metal members are smoothly transferred to the metal members that are the first layers 3-1 and 4-1, the first layers 3-1 and 4-1 being layers that contacts the hollow portion 5 and having a thermal conductivity of greater than or equal to 200 W/m·K, namely a relatively high thermal conductivity, and the metal members that are the first layers 3-1 and 4-1 also melt rapidly. Therefore, even if the peripheral portion of the protruded portion 6 is welded with the resistance welding machine 11 such as a seam welding machine, similarly to the welding by the laser beam 7, occurrence of distortion in the container 2 can be further reduced, and an airtightness of the hollow portion 5 having a wick structure further improves.

An exemplary use of the planar heat pipe according to the embodiment of the present invention will now be described. Herein, a case in which a flexible printed wiring board on which CPU, etc. are mounted inside an electronic device such as a PC is cooled using the planar heat pipe of the present invention will be described by way of example. Depending on the condition of a gap inside an electronic device and the accommodation condition of the flexible printed wiring board, the planar heat pipe is bent as appropriate to thermally connect the flexible printed wiring board to the heat input side of the planar heat pipe. At the heat output side of the planar heat pipe, fins for heat dissipation are provided as needed. Thereby, a flexible printed wiring board accommodated in a small space inside an electronic device can be cooled in a planar manner.

Also, the planar heat pipe according to the embodiment of the present invention may be mounted on a heat sink to improve a cooling capacity of the heat sink. Such mounting method may be a method of thermally connecting the heat output side of the planar heat pipe to the heat receiving block surface of the heat sink, a method of thermally connecting the heat input side of the planar heat pipe to the heat receiving block of the heat sink and thermally connecting the heat output side of the planar heat pipe to heat radiation fins of the heat sink, or the like.

Other embodiments of the present invention will be described below. With the planar heat pipe 1, 10 according to each of the embodiments described above, each of the first layer 3-1, 4-1 and the second layer 3-2, 4-2 has a single layered structure composed of a single type of metal member, but alternatively, a structure with two or more layers formed of metal members of two or more types of layers may be used. In this case, a specific type of metal of the metal member may be types of metal described above.

With the planar heat pipe 1, 10 according to each of the embodiments described above, each of the other plate-shaped body 3 and the one plate-shaped body 4 is a composite member comprising the first layer 3-1, 4-1 that contacts the hollow portion 5 and the second layer 3-2, 4-2 that contacts the external environment, namely a double layered structure of two types of metal members that are laminated and integrated. However, alternatively, it may be a composite member having a structure comprising three or more layers in which, one or more intermediate layer formed with a metal member of a type which is different from the type of the first layer 3-1, 4-1 and second layer 3-2, 4-2 is further provided between the first layer 3-1, 4-1 and the second layer 3-2, 4-2. A metal member forming the intermediate layer is a metal member having a thermal conductivity of greater than 100 W/m·K but less than 200 W/m·K, and may be, for example, tungsten.

Further, as described above, with the planar heat pipe 1, 10 according to each of the embodiments described above, the other plate-shaped body 3 and the one plate-shaped body 4 are both a double-layered structure comprising the first layer 3-1, 4-1 and the second layer 3-2, 4-2, but alternatively, the other plate-shaped body 3 or the one plate-shaped body 4 may be a member having a single layered structure of only the first layer 3-1, 4-1 or only the second layer 3-2, 4-2. In this exemplary embodiment, in a case where the laser beam 7 is irradiated, in order to positively prevent a distortion from occurring in a container, it is preferable that a plate-shaped body which is irradiated with the laser beam 7 is a composite member having a double layered structure, and a plate-shaped body that is not irradiated with the laser beam 7 is a member having the aforementioned single-layered structure. Note that, in a case where the other plate-shaped body 3 or the one plate-shaped body 4 is a member having the aforementioned single-layered structure, the composite member may of a structure having three or more layers and not a double-layered structure.

With the planar heat pipe 1 according to the first embodiment, a surface of the other plate-shaped body 3 is irradiated with the laser beam 9, but alternatively, a surface of the one plate-shaped body 4 may be irradiated with the laser beam 9, and both the surface of the other plate-shaped body 3 and the surface of the one plate-shaped body 4 may be irradiated with the laser beam 9.

INDUSTRIAL APPLICABILITY

The planar heat pipe of the present invention is particularly useful in the field of cooling a heat generating element, which is an object to be cooled, in a planar and uniform manner, since it has a reduced distortion of the container, an excellent airtightness of the hollow portion and an excellent compatibility to a working fluid such as water.

LIST OF REFERENCE SIGNS

1, 10 planar heat pipe
2 container 3 other plate-shaped body
4 one plate-shaped body
5 hollow portion
8 laser welded portion
12 welded portion by a resistance welding machine

The invention claimed is:

1. A planar heat pipe comprising:
a container having a hollow portion provided at a central portion thereof with two opposing plate-shaped bodies; and
a working fluid enclosed in the hollow portion,
the hollow portion being provided with a wick structure,
at least one of the plate-shaped bodies being a composite member of two or more types of metal members that are laminated and integrated,
a metal member of the composite member forming a layer that contacts the hollow portion having a thermal conductivity of greater than or equal to 200 W/m·K and a metal member of the composite member forming a layer that contacts an exterior having a thermal conductivity of less than or equal to 100 W/m·K, a peripheral portion of the hollow portion being sealed.

2. The planar heat pipe according to claim 1, wherein the peripheral portion of the hollow portion is sealed by laser beam welding.

3. The planar heat pipe according to claim 1, wherein the peripheral portion of the hollow portion is sealed by resistance welding.

4. The planar heat pipe according to claim 1, wherein the composite member is a cladded material or a plated material.

5. The planar heat pipe according to claim 1, wherein the metal member forming the layer that contacts the hollow portion is of copper, and the metal member forming the layer that contacts the exterior is of stainless steel.

6. The planar heat pipe according to claim 1, wherein the metal member forming the layer that contacts the hollow portion has a layer thickness of less than or equal to half a thickness of the composite member.

7. A heat sink comprising a planar heat pipe,
the planar heat pipe including:
a container having a hollow portion provided at a central portion thereof with two opposing plate-shaped bodies; and
a working fluid enclosed in the hollow portion,
the hollow portion being provided with a wick structure,
at least one of the plate-shaped bodies being a composite member of two or more types of metal members that are laminated and integrated,
a metal member of the composite member forming a layer that contacts the hollow portion having a thermal conductivity of greater than or equal to 200 W/m·K and a metal member of the composite member forming a layer that contacts an exterior having a thermal conductivity of less than or equal to 100 W/m·K, a peripheral portion of the hollow portion being sealed.

* * * * *